United States Patent [19]
Huang

[11] Patent Number: 5,621,229
[45] Date of Patent: Apr. 15, 1997

[54] SEMICONDUCTOR DEVICE AND CONTROL METHOD

[75] Inventor: Qin Huang, Blacksburg, Va.

[73] Assignee: Fuji Electric Co., Ltd., Kawasaki, Japan

[21] Appl. No.: 434,243

[22] Filed: May 4, 1995

[30]  Foreign Application Priority Data

May 5, 1994 [GB] United Kingdom .................. 9408896

[51] Int. Cl.$^6$ .................................................. H01L 23/58
[52] U.S. Cl. ........................... 257/212; 257/110; 257/133; 257/146
[58] Field of Search ..................... 257/212, 110, 257/132, 133, 146, 172

[56]     References Cited

U.S. PATENT DOCUMENTS

| | | | |
|---|---|---|---|
| 4,998,156 | 3/1991 | Goodman et al. | 257/212 |
| 5,105,244 | 4/1992 | Bauer | 357/23.4 |

FOREIGN PATENT DOCUMENTS

| | | | |
|---|---|---|---|
| 0487869 | 10/1991 | European Pat. Off. | H01L 29/74 |
| 2190539 | 5/1986 | United Kingdom | H01L 27/06 |
| 9116730 | 10/1991 | WIPO. | |

*Primary Examiner*—Mark V. Prenty
*Attorney, Agent, or Firm*—Morrison Law Firm

[57]               ABSTRACT

A semiconductor device which reduces the turn-off time and the accompanying switching loss in a switching semiconductor device in which conductivity modulation is used to provide a low ON-state voltage. The conductivity modulation is provided by injection of minority carriers. A minority carrier injection-control structure is provided in part of a semiconductor device to change the polarity of a voltage applied to a gate electrode to start or stop the injection of minority carriers. During the ON-state, minority carriers are injected to obtain a low ON-state voltage, while during the OFF-state, the injection of minority carriers are stopped and a channel for majority carriers is formed to eliminate the accumulation of excess carriers and to accelerate discharge, thereby reducing the turn-off time and thus the switching loss.

17 Claims, 5 Drawing Sheets

SEMICONDUCTOR DEVICE AND CONTROL METHOD

BACKGROUND OF THE INVENTION

The present invention relates to semiconductor devices that provide conductivity modulation and serve as semiconductor switching elements. More particularly, the present invention relates to a semiconductor device that provides conductivity modulation and serves as a semiconductor switching element for power conversion or control equipment, as well as a method for controlling such a semiconductor device.

Among conventional devices, semiconductor devices used for power conversion or for control equipment are required to have a small voltage drop when turned on. This feature is necessary in order to minimize power loss. Accordingly, a thyristor or an insulation gate bipolar transistor (hereinafter referred to as IGBT) is suitable for applications that require a high-voltage blocking capability.

Figure 8:
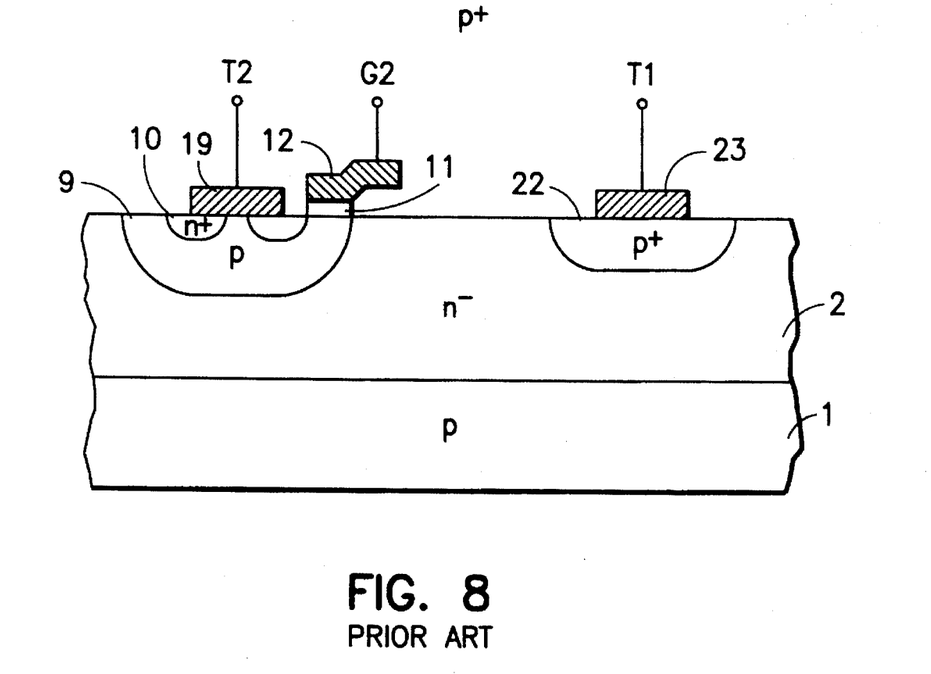
FIG. 8 is a cross section of a conventional lateral IGBT.

Referring to FIG. 8, a sectional view of a basic structure for describing the configuration and operation of the IGBT is shown. This lateral structure allows an IGBT to be incorporated on the output side of an integrated circuit. In an actual semiconductor device, a plurality of such structures are placed in parallel along one plane.

The IGBT of FIG. 8 is formed by forming an n-type high-resistivity n− layer 2 laminated by, for example, an epitaxial method on a p-type silicon substrate 1, forming a p-type (p) base region 9 on part of the surface layer of the n− layer 2 by diffusing impurities from the surface. The next step is forming an n+ source region 10 on part of the surface layer of the p-type (p) base region 9, similarly by diffusing impurities from the surface.

The process then involves providing a second gate electrode 12 connected to a second gate terminal G2 via a second gate oxide film 11 on the surface of the part of the p-type (p) base region 9 between the n− layer 2 and the n+ layer source region 10. Additionally, a source electrode 19 connected to a second main terminal T2 commonly contacts the n+ source region 10 and the (p) base region 9. On the right-hand side of the figure, a p+ drain region 22 is similarly formed by diffusing impurities from the surface, and a drain electrode 23 connected to the first main terminal T1 contacts p+ drain region 22.

This lateral IGBT can be turned on or off by applying a voltage to the second gate electrode 12. When a positive voltage is applied to the second gate electrode 12 from the second gate terminal G2 with a forward voltage applied to the IGBT, (i.e., a voltage that is positive relative to T2 is applied to a main terminal T1), electrons (e) that are majority carriers flow into the n− layer 2 from the n+ source region 10 via an inversion layer formed on the surface of the p-type (p) base region 9 directly below the second gate electrode 12, and then flow into the p+ drain region 22 through the forwardly biased junction between the n− layer 2 and p+ drain region 22.

Therefore, according to this device, the structure including the (p) base region 9 on the source electrode 19 side of the IGBT controls the injection of majority carriers. This current corresponds to the base current of a pnp transistor having the (p) base region 9 as a collector, the n− layer 2 as a base, and the p+ drain region 22 as an emitter. Therefore, when this bipolar transistor is turned on, a collector current flows from emitter to collector. That is, the current flows from p+ drain region 22 to p-type (p) base region 9 to conduct electricity between the main terminals T1 and T2. When electrons (e) are injected into the p+ drain region 22, many holes (h) are reversibly injected from p+ drain region 22 to n− layer 2, thereby providing conductivity modulation. This effect makes the ON-state voltage between the main terminals T1 and T2 substantially lower than that of a normal MOSFET.

The IGBT can be turned off simply by removing the voltage of the second gate electrode 12 to eliminate the inversion layer on the surface layer of the p-type (p) base region 9 directly below the second gate electrode 12, thereby stopping majority carriers (e) from flowing into the n− layer 2. After the IGBT is turned off, the depletion layer widens inside the n− layer 2 to stop charged atoms.

Figure 9:
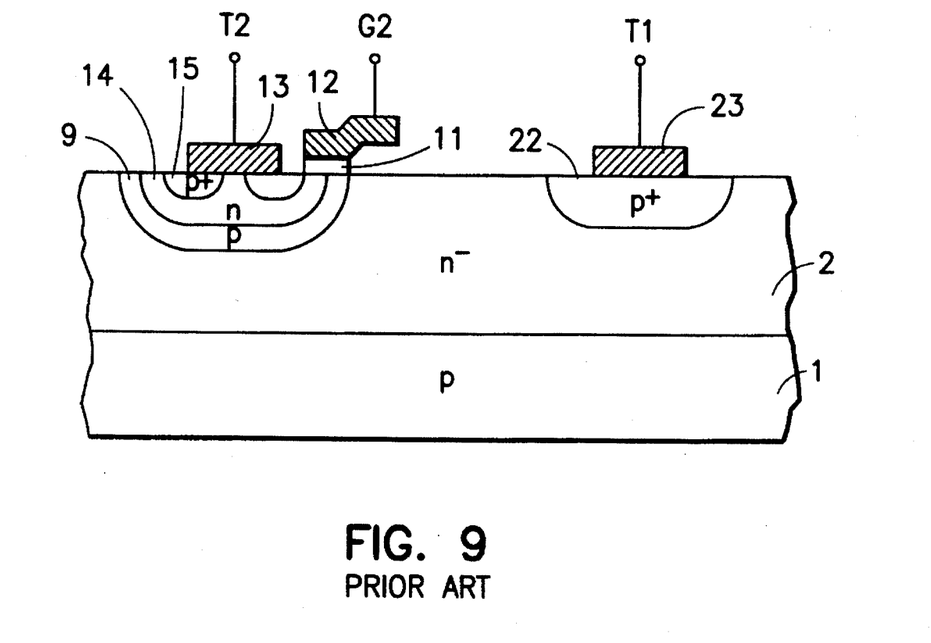
FIG. 9 is a cross section of a conventional lateral MCT.

Referring to FIG. 9, a sectional view of the basic structure of a lateral MOS control thyristor (hereinafter referred to as an MCT) that can be turned off by a MOS gate is shown. An n-type high-resistivity n− layer 2 is laminated by, for example, an epitaxial method on a p-type silicon substrate 1, and a p-type (p) base region 9 is formed on part of the surface layer of the n− layer 2 by diffusing impurities from the surface thereof. An n-type (n) base region 14 is formed on part of the surface layer of the p-type (p) base region 9, also by diffusing impurities from the surface. A p+ cathode region 15 with an impurity concentration higher than that of the p-type (p) base region 9 is formed on part of the n-type (n) base region 14.

A cathode electrode 13 connected to the second main terminal T2 is provided to contact both the p+ cathode region 15 and the n-type (n) base region 14. A second gate electrode 12 is provided via a second oxide film 11 on the surfaces of both the n-type (n) base region 14 and p-type (p) base region 9 between the n− layer 2 and the p+ cathode region 15.

On the right-hand side of the figure, a p+ drain region 22 is similarly formed by diffusing impurities from the surface, and a drain electrode 23 connected to the first main terminal T1 contacts the p+ drain region 22.

This MCT is turned on by applying a positive voltage to the second gate electrode 12, which is connected to the second gate terminal G2, with a voltage that is positive relative to T2 applied to the main terminal T1. Then, an inversion layer is formed on the surface of the (p) base region 9 directly below the second gate electrode 12, and electrons (e) flow into the n− layer 2 via the inversion layer and then into the p+ drain region 22.

That is, the structure including the (p) base region 9 on the cathode electrode side of the MCT controls the injection of majority carriers. This current corresponds to the base current of a pnp transistor having the (p) base region 9 as a collector, the n− layer 2 as a base, and the p+ drain region 22 as an emitter. Therefore, when this bipolar transistor is turned on, a collector current flows from emitter (p+ drain region 22) to collector (p-type (p) base region 9).

The current flows from p+ drain region 22 to (p) base region 9 to conduct electricity between the main terminals T1 and T2. As in the IGBT discussed above in FIG. 8, holes (h) that are minority carriers are injected from p+ drain region 22 to n− layer 2, causing conductivity modulation to reduce the ON-state voltage during conduction. The MCT is turned off by applying a negative voltage to the gate electrode 12.

As a result, the inversion layer on the surface of the (p) base region 9 vanishes, and at the same time, an inversion layer is formed on the surface of the (n) base region 14 directly below the second gate electrode 12. Thus, the (p)

base region 9 is shorted with the cathode electrode 13 via the p+ cathode region 15 to stop electrons (e) from flowing from the (n) base region 14 into the n− layer, thereby turning off the MCT.

As described above, although the IGBT can be easily turned on or off using the insulation type second gate electrode with a high input impedance, and allows the ON-voltage to be reduced during the ON state using the conductivity modulation of the n− layer 2, many carriers that have contributed to conductivity modulation thus far must be removed from the n− layer 2 to widen the depletion layer.

Thus, it takes a long time to remove the carriers, resulting in a substantially long turn-off time and thus an increase in switching loss during the OFF state. Particularly, if a current that is an inductive load is cut off, the inductance attempts to maintain the original current and causes a large counter-electromotive force to be applied to the element. As a result, the depletion layer widens and a current draining the electrons (e) starts to flow. This current acts as the base current of a pnp transistor having the (p) base region 9 as a collector, the n− layer 2 as a base, and the p+ drain region 22 as an emitter to flow into the p+ drain region 22.

In conventional devices, a collector current flows during OFF state. That is, holes (h) that are minority carriers continue to be injected from p+ drain region 22 to n− layer 2 to increase the turn-off time. In addition, switching loss during this state increases substantially. Since switching loss occurs each time switching is performed, it has a significant adverse effect on applications involving high-frequency circuits, which requires fast switching of the IGBT, and may nullify one valuable advantage of the IGBT, namely that the steady-state loss is small because the ON-state voltage is small.

In order to improve such turn-off characteristics, the lifetime of carriers can be reduced to accelerate their removal by diffusing heavy metals such as gold and platinum, or by providing irradiation with a radiation source such as an electron beam. These techniques are referred to as 'lifetime killers'.

However, the introduction of a life-time killer has the negative effect of increasing the ON-state voltage and has no effect on the continued injection of minority carriers during the OFF state. The problems described above in conjunction with the IGBT also occur in the MCT.

Although the above example is described in conjunction with a lateral semiconductor device suitable for incorporation into an integrated circuit wherein an n-type high-resistivity semiconductor layer is formed on a p-type silicon substrate, the above operation is not limited to this structure. It is also applicable to a lateral or a vertical semiconductor device on an n-type substrate. In addition to the IGBT and MCT, it is also applicable to other semiconductor devices that provide conductivity modulation when minority carriers are injected.

OBJECTS AND SUMMARY OF THE INVENTION

Accordingly it is an object of the present invention to provide a semiconductor device and control method that overcomes the drawbacks of the prior art.

It is further object of the invention to provide a semiconductor device that reduces the turn-off time and provides small switching loss without nullifying the advantageous low ON-state voltage that can be obtained by conductivity modulation.

Briefly stated, there is provided a semiconductor device which reduces the turn-off time and the accompanying switching loss in a switching semiconductor device in which conductivity modulation is used to provide a low ON-state voltage. The conductivity modulation is provided by injection of minority carriers. A minority carrier injection-control structure is provided in part of a semiconductor device to change the polarity of a voltage applied to a gate electrode to start or stop the injection of minority carriers. During the ON-state, minority carriers are injected to obtain a low ON-state voltage, while during the OFF-state, the injection of minority carriers are stopped and a channel for majority carriers is formed to eliminate the accumulation of excess carriers and to accelerate discharge, thereby reducing the turn-off time and thus the switching loss.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

In order to achieve the above objective, the semiconductor device according to the present invention includes a minority carrier injection-control structure that can control the injection of minority carriers into a high-resistivity semiconductor layer of a first conductivity type using a voltage applied to a gate electrode.

The minority carrier injection-control structure includes an outer well region of a second conductivity type formed on part of the surface layer of the high-resistivity semiconductor layer of first conductivity type, an inner well region of the first conductivity type formed on part of the surface layer of the outer well region, an anode region of the second conductivity type formed on part of the surface layer of the inner well region, an anode electrode contacting in common the surfaces of the anode region and the inner well region, and a gate electrode formed via an insulation film on the surfaces of the inner well region and the outer well region between the anode region and the high-resistivity semiconductor layer.

It is to be understood that the first conductivity type referred to herein may be either n-type or p-type, and the second conductivity type will thus be p-type or n-type, respectively.

The minority carrier injection-control structure can replace the minority carrier injection structure (in this case, a drain region of the second conductivity type) of a semiconductor device, such as an IGBT or MCT, which uses conductivity modulation provided by the injection of minority carriers in order to reduce the ON-state voltage.

In a semiconductor device that has a minority carrier injection-control structure with a base region of the second conductivity type included in part of a high-resistivity layer of the first conductivity type, as in the source electrode side of an IGBT or the cathode electrode side of an MCT, a majority carrier injection-control structure and the minority carrier injection-control structure can exist on either the same surface or different opposed surfaces of the high-resistivity layer of the first conductivity type.

If the majority and minority carrier injection-control structures exist on the same surface of the high-resistivity layer of first conductivity type, the other surface of this layer can be a layer of the second or first conductivity type.

In another structure, a buffer region of the first conductivity type, with a resistivity lower than that of the high-resistivity layer of first conductivity type, is provided on part of the surface layer of the high-resistivity layer, and the well of second conductivity type, and other layers shown above as the minority carrier injection-control structure, are formed within the first conductivity type buffer region.

Another effective structure has a low-resistivity region of first conductivity type, which is larger than the projected area of the well of the second conductivity type, buried in the interface between the substrate of second conductivity type and the high-resistivity layer of first conductivity type located below the well.

In order to operate the minority carrier injection-control structure, a voltage can be applied at the same time to the gate electrodes of both the minority and the majority carrier injection-control structures. However, it is better to apply the voltage to the gate electrode of the minority carrier injection-control structure before applying it to the gate electrode of the majority carrier injection-control structure.

Another effective structure is a rectification element structured so that a semiconductor layer of first conductivity type with an impurity concentration higher than that of the high-resistivity semiconductor layer of first conductivity type is provided to contact the surface of the high-resistivity semiconductor layer of first conductivity type on which the well region of second conductivity type is not formed.

In order to operate the minority carrier injection-control structure comprising a rectification element, it is desirable to apply a voltage to the gate electrode capable of forming an inversion layer on the surface layer of the well region of first conductivity type directly below the gate electrode while the junction between the semiconductor layer of the first conductivity type and the well region of second conductivity type is steadily biased in the forward direction, and to apply a voltage to the gate electrode in order to remove the above inversion layer and form an inversion layer on the surface layer of the well region of second conductivity type directly below the gate electrode immediately before the junction is reversely biased.

This followed by again applying a voltage to the gate electrode which is effective to remove the inversion layer on the surface layer of the well region of second conductivity type directly below the gate electrode and forming an inversion layer on the surface layer of the well region of first conductivity type directly below the gate electrode after the above junction is reversely biased.

Minority carriers are injected by applying an appropriate electrical potential to the gate electrode of the minority carrier injection-control structure provided on part of the surface layer of the high-resistivity semiconductor layer of first conductivity type, to form an inversion layer on the surface layer of the well of first conductivity type in the well of second conductivity type directly below the gate electrode and so as not to form an inversion layer on the surface layer of this well, thereby connecting the well of second conductivity type to the anode region of second conductivity type and applying a voltage such that the pn junction between the well region of second conductivity type and the high-resistivity layer of first conductivity type is forwardly biased.

In contrast, a voltage reverse to the above is applied to the gate electrode so that an inversion layer will not be formed on the surface layer of the well region of first conductivity type in the well of second conductivity type directly below the gate electrode, and an inversion layer can be formed on the surface layer of the well region of second conductivity type, resulting in a floating electric potential in the well region of second conductivity type.

Simultaneously, the high-resistivity layer of first conductivity type is connected to the well region of first conductivity type to stop the injection of minority carriers.

In this manner, the voltage applied to the gate electrode for minority carrier injection-control can control the injection of minority carriers. During the ON state, this allows many majority and minority carriers to be injected to cause conductivity modulation to reduce ON-state voltage.

The injection of minority carriers can be stopped at the same time as or immediately before turning-off in order to reduce the number of minority carriers as well as the switching loss. Therefore, a semiconductor device with a low ON-state voltage and switching loss can be obtained by omitting the drain region having a conductivity type different from that of the high resistivity semiconductor layer, which is conventionally provided to cause conductivity modulation, and providing instead a minority carrier injection-control structure.

It is assumed that the minority carrier injection-control structure replaces the drain electrode side structure of the IGBT. An appropriate voltage is applied to the gate terminal of the minority carrier injection-control structure to form an inversion layer on the surface layer of the well region of first conductivity type directly below the gate electrode and so as not to form an inversion layer on the surface layer of the well region of second conductivity type, thereby connecting the well region of second conductivity type to the anode region of second conductivity type.

At this point in time, if a positive voltage is applied to the second gate, the injection of minority carriers starts, as in an ordinary IGBT, and the semiconductor device with the same functions as those of the IGBT is turned on. Also similar to the IGBT, ON-state voltage is reduced by the conductivity modulation caused by the injection of minority carriers.

In contrast, a voltage reverse to the above is applied to the gate electrode so that an inversion layer will not be formed on the surface layer of the well region of first conductivity type directly below the gate electrode and an inversion layer can be formed on the surface layer of the well region of second conductivity type, resulting in a floating electric potential in the well region of second conductivity type. Simultaneously, the high-resistivity layer of first conductivity type is connected to the well region of first conductivity type and the injection of minority carriers stops.

At this point in time, or after the minority carriers have been sufficiently reduced, if the positive voltage of the second gate is removed the inversion layer formed on the surface layer of the base region of second conductivity type vanishes and the injection of electrons (e), which are majority carriers, stops to turn off the semiconductor device with the same functions as those of the IGBT.

However, the injection of minority carriers no longer occurs at this point in time, and so both electrons (e) and holes (h) are rapidly discharged to reduce the turn-off time.

If the drain electrode side structure of the MCT is replaced by the minority carrier injection-control structure, the ON-state voltage is kept low by conductivity modulation; during the OFF state, the injection of minority carriers is stopped to reduce the turn-off time.

In addition, in the semiconductor device with a majority carrier injection-control structure having a high-resistivity layer of first conductivity type which includes the second conductivity type base region, the effect of the minority carrier injection-control structure does not depend upon whether the majority and minority carrier injection-control structures exist on the same surface or different surfaces of the high-resistivity layer of first conductivity type. During the ON state, minority carriers are injected to provide conductivity modulation to reduce the ON-state voltage, while during the OFF state, the injection of minority carriers is stopped to reduce the turn-off time.

If the majority and minority carrier injection-control structures exist on the same surface of the high-resistivity layer of first conductivity type and the other surface is a second conductivity type layer, a separation structure can be provided between the two control structures, resulting in a device suitable for integrating elements with many discrete functions into a single semiconductor and for integrating elements with the functions of the IGBT and MCT according to this invention.

A structure with a high-resistivity layer of first conductivity type wherein the majority and minority carrier injection-control structures are on the same surface, and wherein the other face of the high-resistivity layer of first conductivity type includes a first conductivity type layer, can be arranged in parallel in a single semiconductor chip containing elements with the function of an IGBT or MCT according to this invention.

A first conductivity type buffer region with a resistivity lower than that of the high-resistivity layer of first conductivity type can be disposed on part of the surface layer of the high-resistivity layer of first conductivity type, and a well of second conductivity type and other layers stated above can be disposed within the first conductivity type buffer region to provide a device that effectively prevents punch-through caused by the depletion layer spreading all over the surface of the high-resistivity layer of first conductivity type between the second conductivity type base and well regions. Such a configuration is suitable for semiconductors requiring high-voltage blocking capability. The operation of the minority carrier injection-control structure is as described above.

Furthermore, a structure in which a first conductivity type low-resistivity region larger than the projected area of the well region of second conductivity type is buried in the interface between the second conductivity type substrate and the high-resistivity layer of first conductivity type also effectively prevents punch-through by the depletion layer.

A rectification element, structured so that a first conductivity type semiconductor layer with an impurity concentration higher than that of the first conductivity type high-resistivity semiconductor layer, is provided to contact a part of the surface of the first conductivity type high-resistivity semiconductor layer on which the well region of second conductivity type is not formed, and to provide a low ON-state voltage by injecting minority carriers and allow a reverse-recovery current to be reduced by stopping the injection of minority carriers to reduce the amount of minority carriers accumulated.

In order to operate the minority carrier injection-control structure in a rectification element which has the aforementioned minority carrier injection-control structure, a voltage capable of forming an inversion layer on the surface layer of the well region of first conductivity type directly below the gate electrode is applied to the gate electrode while the pn junction between the first conductivity type high-resistivity semiconductor layer and the well region of second conductivity type is steadily biased in the forward direction, in order to connect the well region of second conductivity type to the collector region of second conductivity type, thereby encouraging holes to be injected from the well region of second conductivity type to the high-resistivity layer of first conductivity type to provide a low ON-state voltage by means of conductivity modulation.

A voltage capable of removing the inversion layer and forming an inversion layer on the surface layer of the well region of second conductivity type directly below the gate electrode is applied to the gate electrode immediately before the pn junction is reversely biased, in order to allow the well region of second conductivity type to float, stopping the injection of minority carriers from the well region of second conductivity type, and thereby to connect the high-resistivity layer of first conductivity type to the well region of first conductivity type, thereby encouraging the discharge of electrons that are majority carriers. At this point in time, since the injection of minority carriers is stopped, the number of carriers is reduced rapidly.

A voltage capable of removing the inversion layer on the surface layer of the well region of second conductivity type directly below the gate electrode and forming an inversion layer on the surface layer of the well region of first conductivity type is applied to the gate electrode after the pn junction is reversely biased, in order to cancel the floating state of the well region of second conductivity type to electrically connect it to the collector region of second conductivity type, thereby providing for the application of a reverse bias to the pn junction.

In this manner, the injection of minority carriers can be stopped before a reverse bias is applied to the rectification element, in order to provide a low ON-state voltage by injecting minority carriers and to reduce substantially the reverse recovery current.

Figure 1:
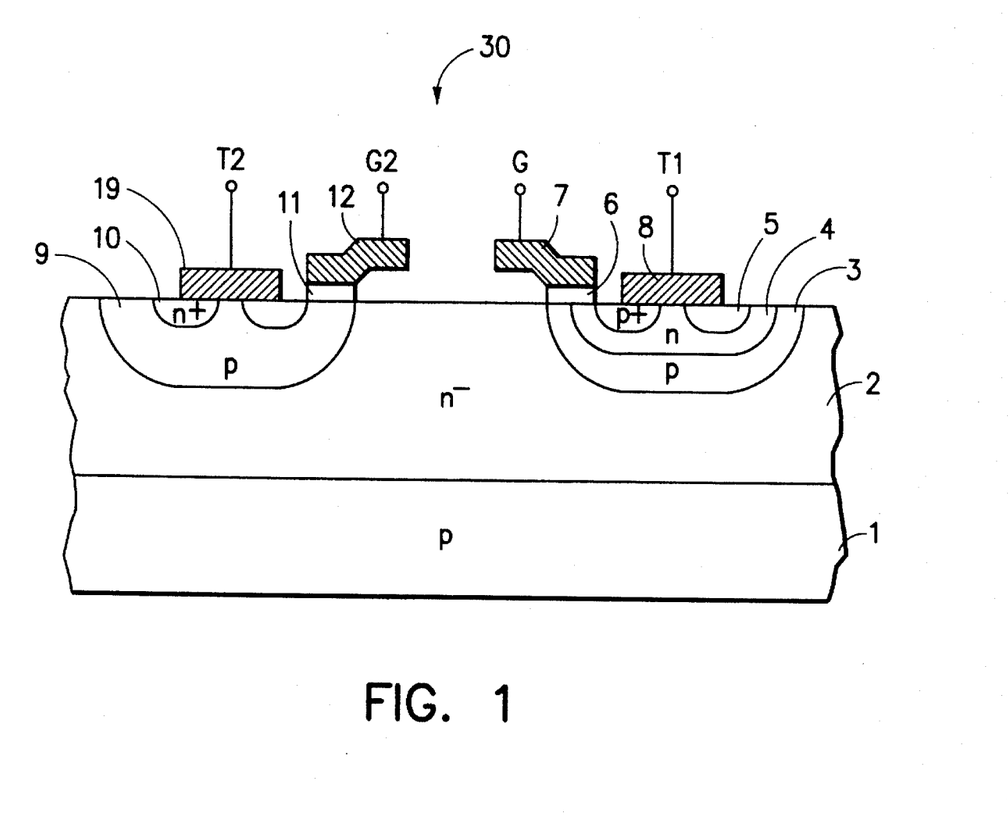
FIG. 1 is a cross section of a first embodiment of the present invention functioning as a lateral IGBT.

Referring to FIG. 1, a semiconductor device according to a first embodiment, shown generally at 30, includes a (p) outer well region 3 formed on part of the surface layer of an n– high resistivity layer 2 by diffusing p-type impurities. An (n) inner well region 4 is formed inside the (p) outer well region 3 by diffusing n-type impurities, this structure replacing the p+ drain region 22 and the drain electrode 23 of the lateral IGBT shown in FIG. 8.

Further, a p+ anode region 5, with an impurity concentration higher than that of the (p) outer well region 3, is formed on part of the surface layer of (n) inner well region 4. An anode electrode 8 connected to main terminal T1 is formed in common on the surfaces of the p+ anode region 5 and the (n) inner well region 4. A first gate electrode 7 is provided via a first gate oxide film 6 on the surfaces of the (p) outer well region 3 and the (n) inner well region 4 between the p+ anode region 5 and the n− high resistivity layer 2.

The first gate electrode 7 is connected to a gate terminal G. On the left-hand side of FIG. 1, p-type (p) base region 9, n+ source region 10, source electrode 19 connected to a second main terminal T2, second gate electrode 12 connected to a second gate oxide film 11 and a second gate terminal G2 are formed as in the source side of the IGBT shown in FIG. 8.

The semiconductor device of FIG. 1 operates in the following manner: First, it is assumed that electricity is allowed to flow through the semiconductor device. When a voltage which is equal to or exceeds the negative threshold value is applied to first gate terminal G, an inversion layer is formed on the surface of the (n) inner well region 4 directly below first gate electrode 7. The (p) outer well region 3 is electrically connected to p+ anode region 5 and becomes an element equivalent to the ordinary IGBT shown in FIG. 8.

Thus, if a positive voltage which meets or exceeds the threshold value is applied to the second gate terminal G2 with a forward voltage, i.e. voltage applied to the main terminal T1 which is positive relative to T2, applied to the semiconductor device, then an inversion layer is formed on the surface layer of p-type (p) base region 9 directly below second gate electrode 12, between the n+ source region 10 and n− high resistivity layer 2, to inject electrons that are majority carriers from n+ source region 10 to n− high resistivity layer 2.

On the other hand, the pn junction between the (p) outer well region 3 and the n− high resistivity layer 2 is forwardly biased and holes that are minority carriers are injected from (p) outer well region 3 to n− high resistivity layer 2, thereby causing conductivity modulation to reduce the resistance of the n− high resistivity layer 2. This ON state is substantially the same as that of the conventional IGBT shown in FIG. 8.

Assume for the purpose of the description hereinafter that the semiconductor device is turned off. A positive voltage is applied to the gate terminal G during the ON state to remove the inversion layer on the surface layer of the (n) inner well region 4 directly below the first gate electrode 7, and to form an inversion layer on the surface layer of the (p) outer well region 3. In this case, (p) outer well region 3 is electrically separated from the p+ anode region 5. Electrons (e) that are injected from n+ source region 10 to n− high resistivity layer 2 through the inversion layer on the surface layer of the p-type (p) base region 9, which is formed by the positive voltage to the second gate terminal G2, flow through the inversion layer on the surface layer of the (p) outer well region 3 into the (n) inner well region 4 and reach the anode electrode 8.

Thus, injection of holes (h) from (p) outer well region 3 to n− high resistivity layer 2 ceases. Thereafter, conductivity modulation causes electric fields in the semiconductor layer to rapidly discharge holes (h) stored in the n− high resistivity layer 2 to the source electrode 19. Remaining holes vanish after recombination. The element acts as a MOSFET in this state. Therefore, if the positive voltage applied to the second gate terminal G2 is turned off during this state or after a sufficient number of holes are removed, the element is turned off very quickly, behaving just like a MOSFET, to provide a very small switching loss.

The turn-off time of the semiconductor device with the minority carrier injection-control structure is typically one-tenth that of the conventional IGBT illustrated in FIG. 8.

In addition to the method of controlling the first gate terminal G and the second gate terminal G2 with different timings, it is possible to control the voltage of the first gate terminal G at the same time when the positive potential of the second gate terminal G2 of the semiconductor device is turned off. In this case, although the turn-off time becomes slightly longer, the switching loss can be reduced by preventing the injection of minority carriers caused by discharge of electrons (e) associated with the widening of the depletion layer after the second gate is turned off, particularly when an inductive load is turned off. In this case, the control circuit can be simplified because the voltage of the gate is controlled at the same time.

Specifically, this invention includes a structure that can control the injection of minority carriers into the drain part to act as an IGBT during a conductive state, to provide a low ON-state voltage, and to act as a MOSFET during switching by providing a rapid turn-off interval and low switching loss.

Although an ordinary IGBT has a range of voltage higher than that of a MOSFET in the low-current region due to built-in voltage in the junction generated by the existence of a pn conjunction in the drain part, the semiconductor device with the minority carrier injection-control structure allows the switching loss to be further reduced by controlling the voltage of the gate terminal in the low-current region to act as a MOSFET without a pn junction in the drain part.

Figure 2:
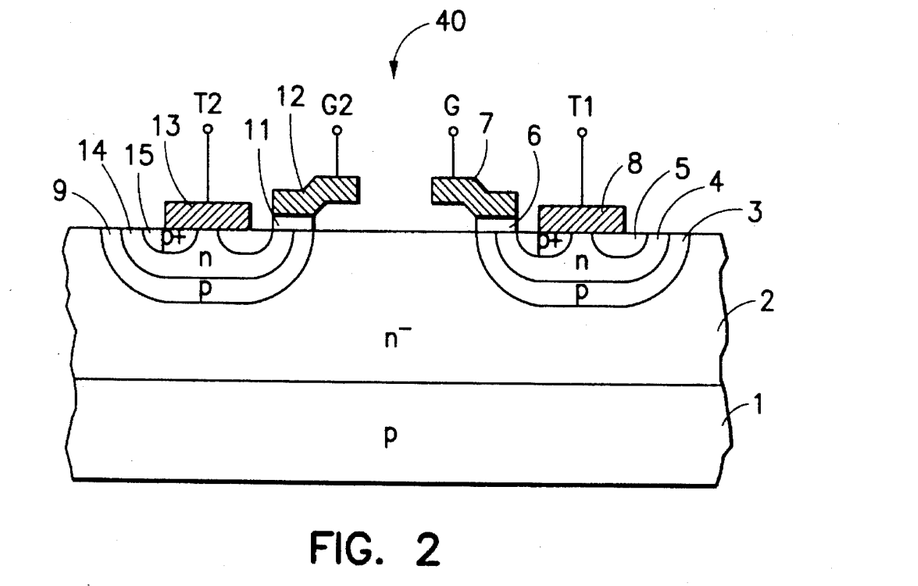
FIG. 2 is a cross section of a second embodiment of the present invention functioning as a lateral MCT.

Referring now to FIG. 2, a semiconductor device according to a second embodiment, shown generally at 40, shows a minority carrier injection-control structure applied to the lateral MCT illustrated in FIG. 9.

FIG. 2 includes on the cathode side, as shown on the left-hand side of FIG. 2, a p-type (p) base region 9 which is provided on part of surface layer of n− high resistivity layer 2. An (n) base region 14 is formed on part of surface of p-type (p) base region 9. A p+ cathode region 15 is formed on part of surface layer of (n) base region 14. A cathode electrode 13 is provided in common on the surfaces of p+ cathode region 15 and (n) base region 14 and connected to the main terminal T2.

A second gate electrode 12 is connected via a second gate oxide film 11 on the surfaces of both (n) base region 14 and p-type (p) base region 9 between the p+ cathode region 15 and n− high resistivity layer 2. The second gate electrode 12 is also connected to the second gate terminal G2. The anode side on the right-hand side of FIG. 2 is provided with a minority carrier injection-control structure which replaces the p+ drain region 22 shown in FIG. 9.

The minority carrier injection-control structure includes a (p) outer well region 3, an (n) inner well region 4, a p+ anode region 5, a first gate oxide film 6, a first gate electrode 7, and anode electrode 8, as in FIG. 1.

The operation of this element is described below. First, it is assumed that electricity is allowed to flow through the element. When a voltage at the negative threshold value or higher is applied to first gate terminal G, an inversion layer is formed on the surface of the (n) inner well region 4 directly below first gate electrode 7. The (p) outer well region 3 is electrically connected to the p+ anode region 5 via the inversion layer and becomes a semiconductor device equivalent to the ordinary MCT in FIG. 8. Thus, if a positive voltage at the threshold value or higher is applied to the second gate terminal G2 with a forward voltage applied to the semiconductor device, that is, a voltage positive relative to T2 is applied to the main terminal T1, an inversion layer is formed on the surface layer of the p-type (p) base region 9 directly below the second gate electrode 12, between the (n) base region 14 and the n– high resistivity layer 2, to inject electrons (e) that are majority carriers from (n) base region 14 to n– high resistivity layer 2.

Alternatively, holes (h) which exemplify minority carriers are injected from (p) outer well region 3 to n– high resistivity layer 2 to cause conductivity modulation to reduce the resistance of the n– high resistivity layer 2. This ON state is substantially the same as that of the conventional MCT shown generally in FIG. 9.

Then, it is assumed that this semiconductor device is turned off. A positive voltage is applied to the gate terminal G during the ON state to remove the inversion layer on the surface layer of the (n) inner well region 4 directly below the first gate electrode 7 and to form an inversion layer on the surface layer of the (p) outer well region 3. In this manner, the (p) outer well region 3 is electrically separated from the p+ anode region 5. Electrons that are injected from (n) base region 14 to n– high resistivity layer 2 through the inversion layer on the surface layer of the p-type (p) base region 9 which is formed by the positive voltage applied to the second gate terminal G2, then flow through the inversion layer on the surface layer of the (p) outer well region 3 into the (n) inner well region 4 and reach the anode electrode 8.

Thus, the injection of holes (h) from (p) outer well region 3 to n– high resistivity layer 2 stops. Then, electric fields in the semiconductor layer cause the holes (h) stored in the n– high resistivity layer 2 due to conductivity modulation to be rapidly discharged to the cathode electrode 13 and reduced in number. Therefore, if positive voltage applied to the second gate terminal G2 is replaced by a negative voltage during this state or after a sufficient number of holes (h) are removed, the inversion layer on the surface layer of the p-type (p) base region 9 directly below the second gate electrode 12 vanishes, an inversion layer is formed on the surface layer of the (n) base region 14, and the p+ cathode region 15 and the p-type (p) base region 9 are shorted via this inversion layer.

Among the excess carriers filled in the n– high resistivity layer 2 due to conductivity modulation, holes (h) flow through the inversion layer followed by the p+ cathode region 15 and into cathode electrode 13. In prior art devices, electrons (e) were required to wait for carriers to vanish after flowing into the (p) outer well region 3 to cause holes (h) to be injected from (p) outer well region 3 to the n– high resistivity layer 2, but applying a positive voltage to the gate terminal G allows the electrons (e) to flow into the cathode electrode 13 without waiting. Therefore, this semiconductor device can be turned off very rapidly, and its switching loss is as small as that of a MOSFET.

Thus, the semiconductor device contemplated by the second embodiment, includes a structure in the anode part, which effectively controls the injection of minority carriers. Essentially, the semiconductor device according to the second embodiment acts as an MCT during the conductive state to provide a low ON-state voltage, while acting as a MOSFET during switching to provide a short turn-off time and a low switching loss.

In addition to the method of controlling the gate terminal G and the second gate terminal G2 with different timings as described above, it is possible to control the voltage of the second gate terminal G2 at the same time when the positive voltage of the gate terminal G is turned on. In this case, although the turn-off time becomes slightly longer due to the presence of excess carriers, the switching loss can be reduced by preventing the injection of minority carriers caused by the discharge of electrons (e) associated with the widening of the depletion layer after the second gate is turned off, particularly when an inductive load is turned off. In this case, the control circuit can be simplified because the two gates are controlled at the same time.

Although, as in the case of the IGBT described earlier, an ordinary MCT has a range of ON-state voltages higher than that of a MOSFET in the low-current region due to the existence of a pn junction in the drain part, the semiconductor device with the minority carrier injection-control structure according to this invention, in addition to MCT functions, allows the switching loss to be further reduced by controlling the voltage of the gate terminal in the low-current region to act as a MOSFET.

Furthermore, the structure contemplated by the second embodiment is capable of correcting a chief disadvantage of the MCT, namely that the numerous carriers existing during the OFF state prevent the depletion layer from widening to reduce the safe operation region during the ON state, by stopping the injection of minority carriers immediately before turning off.

It is understood that the method for using the minority carrier injection region to cause conductivity modulation can be applied not only to a lateral semiconductor device in which the currents flow parallel to the main surface but also to a vertical semiconductor device wherein currents flow perpendicular to the main surface without departing from the invention.

Figure 3:
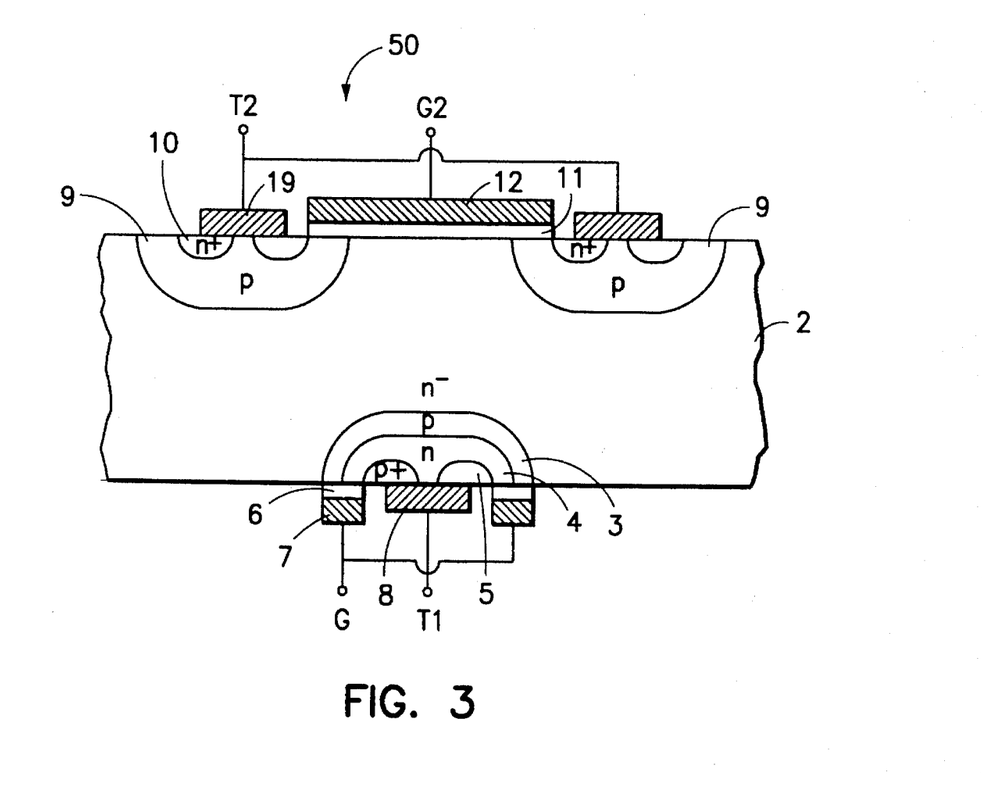
FIG. 3 is a cross section of a third embodiment of the present invention functioning as a vertical IGBT.

Referring to FIG. 3, a semiconductor device according to a third embodiment of the invention, is shown generally at 50. The semiconductor device according to this embodiment contemplates a p-type (p) base region 9, an n+ source region 10, and a second gate electrode 12 arranged so that a source electrode 19, formed on one face of an n– high resistivity layer 2, contacts in common the p-type (p) base region 9 and n+ source region 10, while a p+ anode region 5 and an (n) inner well region 4 that are contacted by anode electrode 8. A (p) outer well region 3 is formed on the other face of the n– substrate 2.

A first gate electrode 7 contacts the (p) outer well region 3 and the (n) inner well region 4 via a first gate oxide film 6. If the structure has a plurality of p-type (p) base regions 9, the second gate oxide film 11 and the second gate electrode 12 may extend to that part of the n– high resistivity layer 2 which is between two p-type (p) base regions 9. The same is applicable to the minority carrier injection-control structure at the bottom of the FIG. 3, and if a plurality of such structures are present, the first gate oxide film 6 and the first gate electrode 7 may extend to adjacent minority injection-control structures on a part of the underneath surface of the n– high resistivity layer 2, which is surrounded by the (p) well region.

The semiconductor device embraced by the third embodiment can operate in the same manner as the semiconductor device of FIG. 1. Although the first and second embodiments are suitable for lateral semiconductor devices and the third embodiment is most appropriate for vertical semiconductor devices, their modes of operation obviously do not differ much from each other. The semiconductor device according to the third embodiment functions in the same manner as a vertical IGBT.

Figure 4:
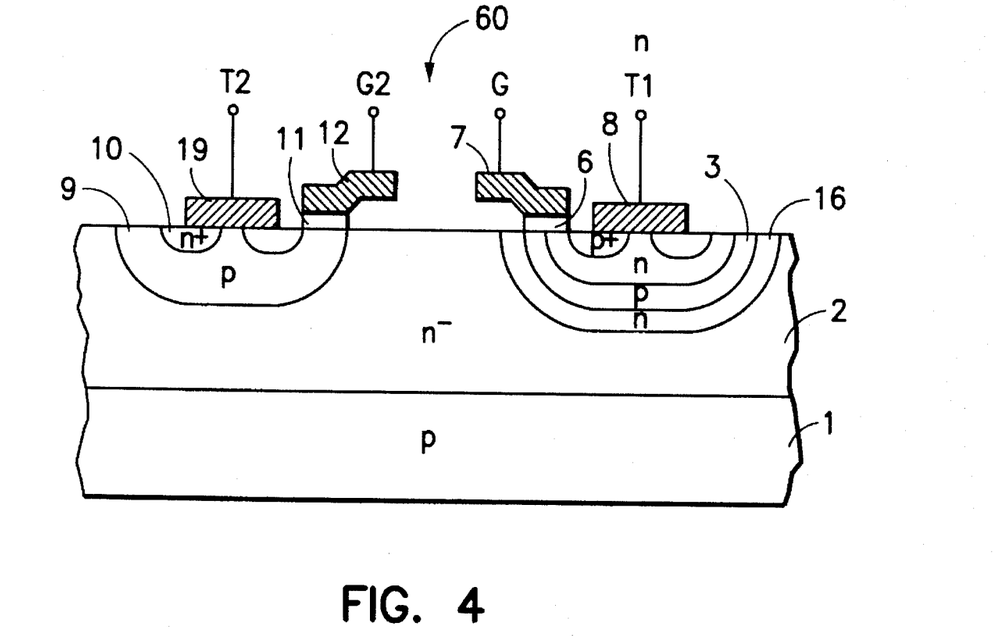
FIG. 4 is a cross section of a fourth embodiment of the present invention functioning as a lateral IGBT.

Referring to FIG. 4, a semiconductor device according to a fourth embodiment of the invention, shown generally at 60, is similar to the first embodiment as shown in FIG. 1, except that an n-type (n) buffer region 16 with an impurity concentration higher than that of the n– high resistivity layer 2 is provided around the p-type outer well region 3.

The semiconductor device contemplated by the fourth embodiment prevents the depletion layer from the p-type region (the p-type (p) base region 9 or the p-type substrate 1) on the cathode potential side from reaching the (p) outer well region 3 to prevent the flow of punch-through currents, in order to provide a semiconductor device with high-voltage blocking capability.

Figure 5:
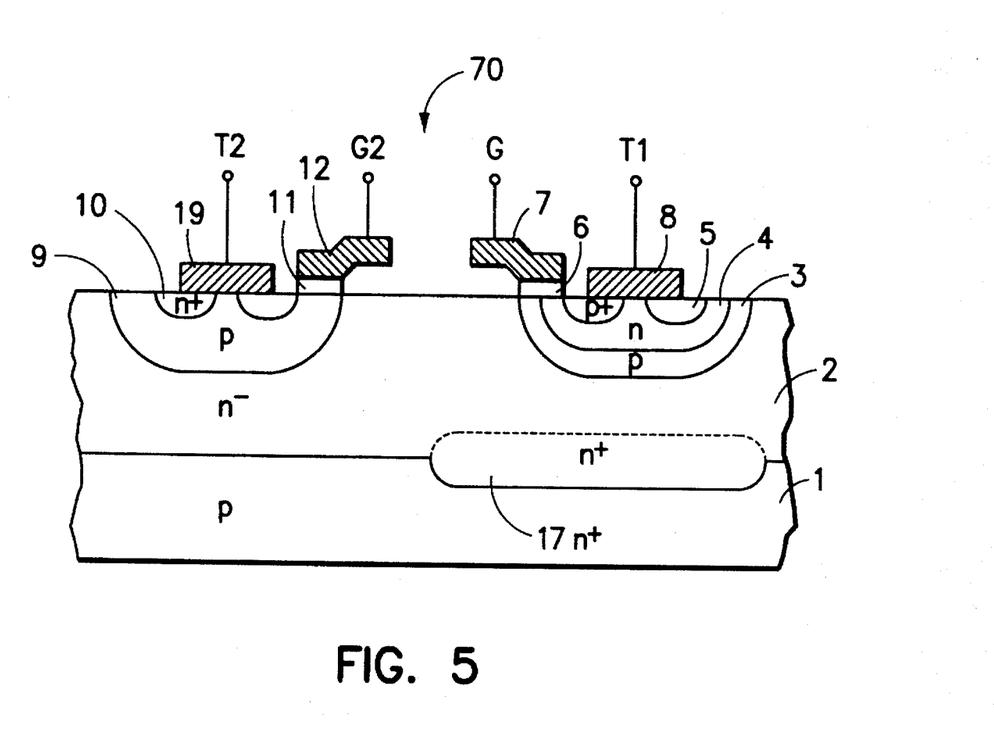
FIG. 5 is a cross section of a fifth embodiment of the present invention functioning as a lateral IGBT.

FIG. 5 embraces a semiconductor device according to a fifth embodiment of the invention, shown generally at 70. The semiconductor device according to the fifth embodiment of the present invention is substantially similar to the device of the first embodiment, shown in FIG. 1, except that an n-type n+ buried region 17 with an impurity concentration higher than that of the n– high resistivity layer 2 is provided between the p-type silicon substrate 1 and the n– high resistivity layer 2. As with the structure in FIG. 4, the structure illustrated by FIG. 5, also prevents punch-through.

Also, the device according to this embodiment reduces the difficulty in controlling threshold values due to multiple diffuseness. The n+ buried region 17 must be larger than the (p) outer well region 3 above, and can be formed by using known buried-region formation techniques.

Figure 6:
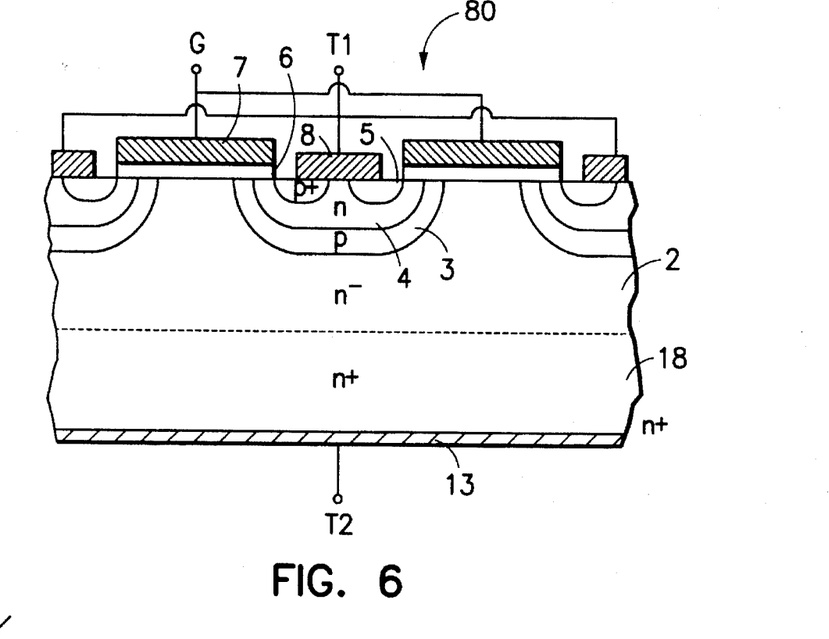
FIG. 6 is a cross section of a sixth embodiment of the present invention functioning as a rectification element.

Referring to FIG. 6, a semiconductor device according to a sixth embodiment of the invention, shown generally at 80, is applied to a rectification element. The n– high resistivity layer 2 is formed on an n-type high resistivity n+ substrate 18 by an epitaxial method.

As in other embodiments, the minority carrier injection-control structure which includes a (p) outer well region 3, an (n) inner well region 4, a p+ anode region 5, an anode electrode 8, a first gate oxide film 6, and the first gate electrode 7 is provided on the surface of the n– high resistivity layer 2. As described in relation to FIG. 3, if a plurality of minority carrier injection-control structures are present, the first gate oxide film 6 and the first gate electrode 7 may extend to an adjacent minority injection-control structure on the part of the n– high resistivity layer 2 that is surrounded by the (p) well region. A cathode electrode 13 connected to the main terminal T2 is provided on the undersurface of the n+ substrate 18.

This element is allowed to operate as an ordinary pn diode by applying to the first gate electrode 7 a voltage that is negative relative to the drain electrode 8 during forward biasing, and by injecting holes (h) that are minority carriers into the n– high resistivity layer 2, as in the embodiment in FIG. 1, to cause conductivity modulation. In addition, a positive voltage can be applied to the gate terminal G immediately before the element is reversely biased to stop the injection of minority carriers to reduce holes (h) and thus reverse recovery currents during reverse recovery, thereby reducing the switching loss.

Figure 7:
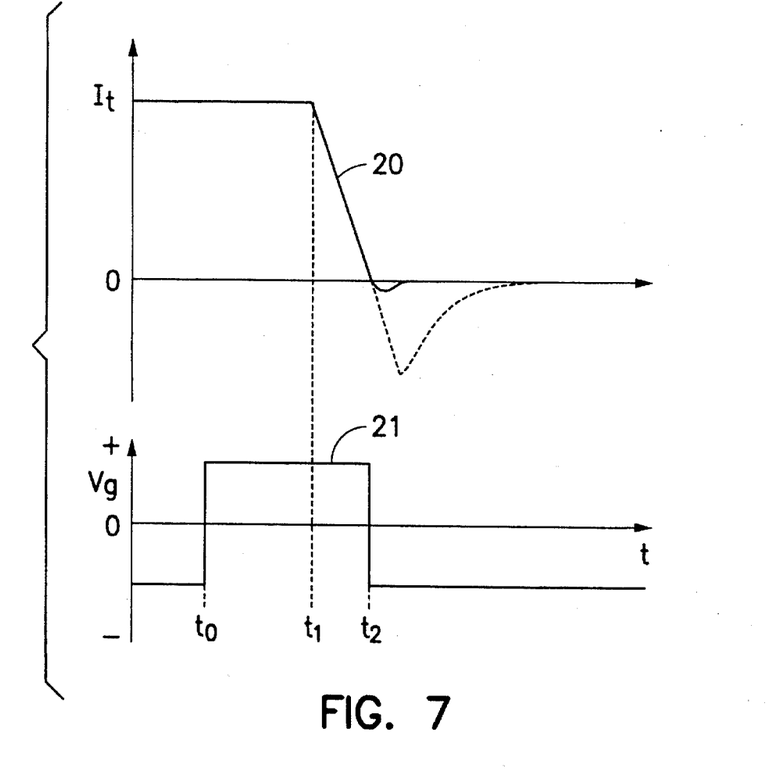
FIG. 7 shows changes in voltage and current when the rectification element in FIG. 6 is turned off.

The graphs of current and voltage plotted against time in FIG. 7 show the relationship between changes in main current and the gate voltage, wherein numeral 20 represents currents flowing through the rectification element and numeral 21 represents the voltage between the gate and the anode electrodes. Before t=t0, a negative voltage is applied to the gate electrode, and the element operates as a pin diode, and conductivity modulation provides a low ON-state voltage.

If a positive voltage is applied to the gate electrode when t=t0, the injection of holes (h) stops. Thus, the conductivity modulation effect of the n– high resistivity layer 2 decreases. In addition, when t=t1, the current of the element is reduced by di/dt determined by an external circuit, and when t=t2, that is, the current is 0, the gate voltage is made negative again. After t=t2, an ordinary pin diode has a large reverse-recovery current flow due to holes (h) in the n– high resistivity layer 2, as shown by the broken line.

However, if the rectification element according to this invention was used to reduce sufficiently the number of holes (h) in the n– high resistivity layer 2 between t0 and t2, only a few reverse-recovery currents flow, as shown by the solid line.

Hence, the switching loss can be substantially reduced and spike currents, induced by the di/dt of the reverse-recovery current, can be controlled to prevent problems such as the damage of peripheral elements. After t=t2, the gate voltage is made negative again to prevent the reduction of voltage-protection capability caused by the floating of the (p) well region 3 during reverse biasing.

Although the structure on the cathode shown so far is equivalent to that of an IGBT or MCT, this invention is clearly also applicable to an element with a structure similar to that of a static induction thyristor (SI thyristor).

Bipolar type semiconductor devices, such as the IGBT, suffer from long turn-off times because the injection of minority carriers to the semiconductor layer does not stop even after an OFF signal is sent to the semiconductor device. The present invention addresses this issue, and provides a minority carrier injection-control structure in the semiconductor device so that a voltage applied to the gate electrode can separate the control structure from the of second conductivity type contacted by the main electrode.

During the ON state, minority carriers are injected from the well region of second conductivity type connected to the anode region of second conductivity type, while during the OFF state, a reverse voltage is applied to the gate electrode to separate the well region of second conductivity type from the anode region of second conductivity type so that the turn-off operation can start after the injection of minority carriers is stopped. As a result, conductivity modulation in the high resistivity semiconductor layer still serves to reduce the ON-state voltage during the ON-state, which is advantageous, while the number of carriers in the high resistivity semiconductor layer, which must be discharged to widen the depletion layer, is reduced during the OFF state to reduce the turn-off time and switching loss significantly compared to those of the prior art.

This invention is applicable not only to a lateral structure suitable for integration but also to a vertical structure fit for a power semiconductor. It is also applicable to a semiconductor device with high-voltage blocking capability by taking measures against punch-through of the depletion layer, such as provision of a buffer or a buried region.

As described above, this invention can be applied to a rectification element to substantially reduce reverse-recovery currents during reverse recovery, and the reverse-recovery currents can be further reduced by controlling the polarity of the voltage to be applied as well as the timing.

In addition to the IGBT, MCT, and rectification elements cited above, this invention is widely applicable to various semiconductor devices employing conductivity modulation, such as static induction thyristors. Particularly, if this invention is implemented in a semiconductor device with high-voltage blocking capability and a high current capacitance, the switching loss can be reduced to improve the power conversion efficiency and the turn-off time can be reduced to expand the applicable frequency range.

What is claimed is:

1. A semiconductor device comprising:
    a high resistivity semiconductor layer of a first conductivity type;

a minority carrier injection-control structure for injecting minority carriers into said high resistivity semiconductor layer;

a first electrode;

said minority injection-control structure being formed on a first surface of said high resistivity semiconductor layer;

means for connecting said minority injection-control structure to said first electrode;

a semiconductor structure formed on a second surface of said high resistivity semiconductor layer;

a second electrode;

means for connecting said semiconductor structure to said second electrode; and said minority carrier injection-control structure further comprising an outer well region of a second conductivity type;

an inner well region of said first conductivity type formed within said outer well region;

a first gate electrode formed in common on surfaces of said inner and said outer well regions, said first gate electrode covering at least a whole lateral span of said surfaces of said inner and said outer well regions and being connected thereto by an insulation film;

a high concentration region of said second conductivity type formed within said inner well region; and said first electrode in a contacting relationship with said inner well region and said high concentration region.

2. A semiconductor device according to claim 1, wherein said semiconductor structure further comprises:

an outer base region of said second conductivity type;

a source region of said first conductivity type formed within said outer base region;

a second gate electrode formed on a surface of said outer base region;

means for contacting said second gate electrode with said outer base region;

said second electrode in a contacting relationship with a surface of both said outer base and said source regions.

3. The semiconductor device according to claim 2, wherein said means for contacting includes an insulating film.

4. The semiconductor device according to claim 1, wherein said semiconductor structure further comprises:

an outer base region of said second conductivity type;

an inner base region of said first conductivity type formed within said outer base region;

a source region of said second conductivity type formed within said inner base region;

a second gate electrode formed on a surface of said outer and inner base regions;

said second gate electrode in a contacting relationship with said outer and inner base regions; and means for contacting said second gate electrode with said outer and inner base regions.

5. The semiconductor device according to claim 4, wherein said means for contacting includes an insulating film.

6. The semiconductor device according to claim 2, wherein said outer well region and said outer base region are formed on the same surface of said high resistivity semiconductor layer of said first conductivity type.

7. The semiconductor device according to claim 4, wherein said outer well region and said outer base region are formed on the same surface of said high resistivity semiconductor layer of said first conductivity type.

8. The semiconductor device according to claim 2, wherein said outer well region and said outer base region are formed on different opposed surfaces of said high resistivity semiconductor layer of said first conductivity type.

9. The semiconductor device according to claim 6, wherein a semiconductor layer of said second conductivity type contacts a surface of said high resistivity semiconductor layer different from and opposed to a surface of said high resistivity semiconductor layer on which said outer well region and said outer base region are formed.

10. The semiconductor device according to claim 7, wherein a semiconductor layer of said second conductivity type contacts a surface of said high resistivity semiconductor layer different from and opposed to a surface of said high resistivity semiconductor layer on which said outer well region and said outer base region are formed.

11. The semiconductor device according claim 6, wherein:

said outer well region of said second conductivity type, is provided within a buffer region of said first conductivity type having an impurity concentration higher than that of said high resistivity semiconductor layer.

12. The semiconductor device according claim 7, wherein:

said outer well region of said second conductivity type, is provided within a buffer region of said first conductivity type having an impurity concentration higher than that of said high resistivity semiconductor layer.

13. The semiconductor device according claim 8, wherein:

said outer well region of said second conductivity type, is provided within a buffer region of said first conductivity type having an impurity concentration higher than that of said high resistivity semiconductor layer.

14. The semiconductor device according claim 9, wherein:

said outer well region of said second conductivity type, is provided within a buffer region of said first conductivity type having an impurity concentration higher than that of said high resistivity semiconductor layer.

15. The semiconductor device according to claim 10, wherein:

an area of an interface between said high resistivity semiconductor layer and said semiconductor layer, located directly below said outer well region, includes a region of said first conductivity type that is larger than a projected area of said outer well region on said interface; and said region having an impurity concentration higher than that of said high resistivity semiconductor layer.

16. The semiconductor device according to claim 10, wherein:

said semiconductor structure is a second semiconductor layer of said first conductivity type with an impurity concentration higher than that of said high resistivity semiconductor layer, and which contacts a surface of said high resistivity semiconductor layer that differs from and is opposed to the surface of said high resistivity semiconductor layer on which said outer well region is formed.

17. A method of controlling a semiconductor device comprising the steps of:

applying a voltage to a first gate electrode of a minority carrier injection-control structure;

said voltage being positive with respect to a high resistivity semiconductor layer of a first conductivity type when said first conductivity type is n type;

said voltage being negative with respect to said high resistivity semiconductor layer of said first conductivity type when said first conductivity type is p type;

applying a voltage for forming a first inversion layer on a surface layer of an inner well region located directly below said first gate electrode to said first gate electrode while applying a voltage to a second gate electrode for holding said semiconductor device at an ON-state; and, applying a voltage for removing said first inversion layer and forming a second inversion layer on a surface layer of an outer well region located directly below said first gate electrode before applying a voltage to said first gate electrode for turning said semiconductor device to an OFF-state.

* * * * *